US009196582B2

(12) United States Patent
Hsu

(10) Patent No.: US 9,196,582 B2
(45) Date of Patent: Nov. 24, 2015

(54) WORD LINE COUPLING PREVENTION USING 3D INTEGRATED CIRCUIT

(71) Applicant: TAIWAN SEMICONDUCTOR MANUFACTURING COMPANY, LTD., Hsinchu (TW)

(72) Inventor: Kuoyuan (Peter) Hsu, San Jose, CA (US)

(73) Assignee: TAIWAN SEMICONDUCTOR MANUFACTURING COMPANY, LTD. (TW)

(*) Notice: Subject to any disclaimer, the term of this patent is extended or adjusted under 35 U.S.C. 154(b) by 0 days.

(21) Appl. No.: 14/087,016

(22) Filed: Nov. 22, 2013

(65) Prior Publication Data
US 2015/0145139 A1    May 28, 2015

(51) Int. Cl.
*H01L 23/522* (2006.01)
*H01L 21/768* (2006.01)

(52) U.S. Cl.
CPC ...... *H01L 23/5226* (2013.01); *H01L 21/76877* (2013.01)

(58) Field of Classification Search
CPC ............... H01L 23/5226; H01L 21/76877; H01L 23/522; H01L 21/768
USPC ......... 257/774, 773, 202, 203, 208, 211, 700, 257/701, 702, 758, 43, E29.068, 529, 528, 257/53, 535; 365/51, 63, 96, 148, 185.2, 365/188.18, 185.17
See application file for complete search history.

(56) References Cited

U.S. PATENT DOCUMENTS

| | | | | |
|---|---|---|---|---|
| 8,699,293 | B2* | 4/2014 | Yan et al. | 365/230.03 |
| 8,792,288 | B1* | 7/2014 | Bartling et al. | 365/189.16 |
| 2008/0219043 | A1* | 9/2008 | Yoon et al. | 365/158 |
| 2009/0207681 | A1* | 8/2009 | Juengling | 365/230.03 |
| 2010/0232200 | A1* | 9/2010 | Shepard | 365/51 |
| 2011/0297912 | A1* | 12/2011 | Samachisa et al. | 257/5 |
| 2012/0032164 | A1* | 2/2012 | Ohnuki | 257/43 |
| 2012/0063203 | A1* | 3/2012 | Matsuzaki et al. | 365/149 |
| 2012/0224408 | A1* | 9/2012 | Yan et al. | 365/148 |
| 2012/0250393 | A1* | 10/2012 | Shirakawa | 365/148 |
| 2012/0294070 | A1* | 11/2012 | Matsuzaki et al. | 365/149 |
| 2012/0306533 | A1* | 12/2012 | Ohmaru | 326/41 |
| 2013/0170283 | A1* | 7/2013 | Lan et al. | 365/148 |
| 2013/0250676 | A1* | 9/2013 | Hishida et al. | 365/185.2 |
| 2013/0264631 | A1* | 10/2013 | Alsmeier et al. | 257/324 |
| 2014/0085978 | A1* | 3/2014 | Lee | 365/185.08 |
| 2014/0126268 | A1* | 5/2014 | Katayama et al. | 365/148 |
| 2014/0211572 | A1* | 7/2014 | Bartling et al. | 365/189.08 |
| 2014/0264521 | A1* | 9/2014 | Matsuzaki et al. | 257/300 |
| 2014/0281135 | A1* | 9/2014 | Balakrishnan et al. | 711/103 |
| 2014/0301131 | A1* | 10/2014 | Siau et al. | 365/148 |
| 2014/0347928 | A1* | 11/2014 | Lee | 365/185.11 |

* cited by examiner

*Primary Examiner* — Alexander Oscar Williams
(74) *Attorney, Agent, or Firm* — Hauptman Ham, LLP

(57) ABSTRACT

A memory comprises a first layer comprising a first line. The memory also comprises second layer comprising a series of bit-cells, a word line driver, and a word line coupled to the word line driver. The memory further comprises a first plurality of through vias coupling the word line to the first line. The word line has a resistance value based on a geometry of the word line, and the first line is configured to reduce the resistance value of the word line by a degree associated with a geometry of the first line.

20 Claims, 7 Drawing Sheets

WORD LINE COUPLING PREVENTION USING 3D INTEGRATED CIRCUIT

BACKGROUND

Device manufacturers are continually challenged to deliver value and convenience to consumers by, for example, providing integrated circuits that perform at optimal levels while occupying minimal space. Integrated circuits having memory cells formed in a two-dimensional layout often suffer from word line delay and interference caused by word line resistance and/or the coupling effect. Memory cells having two-dimensional layouts are unable to minimize word line resistance and coupling in an effective and space efficient manner.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or decreased for clarity of discussion.

DETAILED DESCRIPTION

The following disclosure provides many different embodiments, or examples, for implementing different features of the invention. Specific examples of components and arrangements are described below to simplify the present disclosure. These are examples and are not intended to be limiting.

As integrated circuits and corresponding memory cells continue to shrink, the pitch between bit-cells also continues to shrink. Reduced pitch between bit-cells results in a reduction of word line spacing. Reduced spacing between word lines calls for one or more of reduced word line cross-sectional area and/or reduced spacing between neighboring word lines. Reduced cross-sectional areas of word lines and reduced spacing between neighboring word lines increase the resistance of the word line and increase the coupling effect which, in turn, reduces word line speed and integrated circuit performance. As such, it is difficult to increase, or at least maintain, effective word line speeds while meeting the continual demand for producing integrated circuits and memory cells of minimal size.

Accordingly, it would be advantageous to develop an integrated circuit that reduces resistance and reduces the coupling effect while minimizing the size of the integrated circuit.

Figure 1:
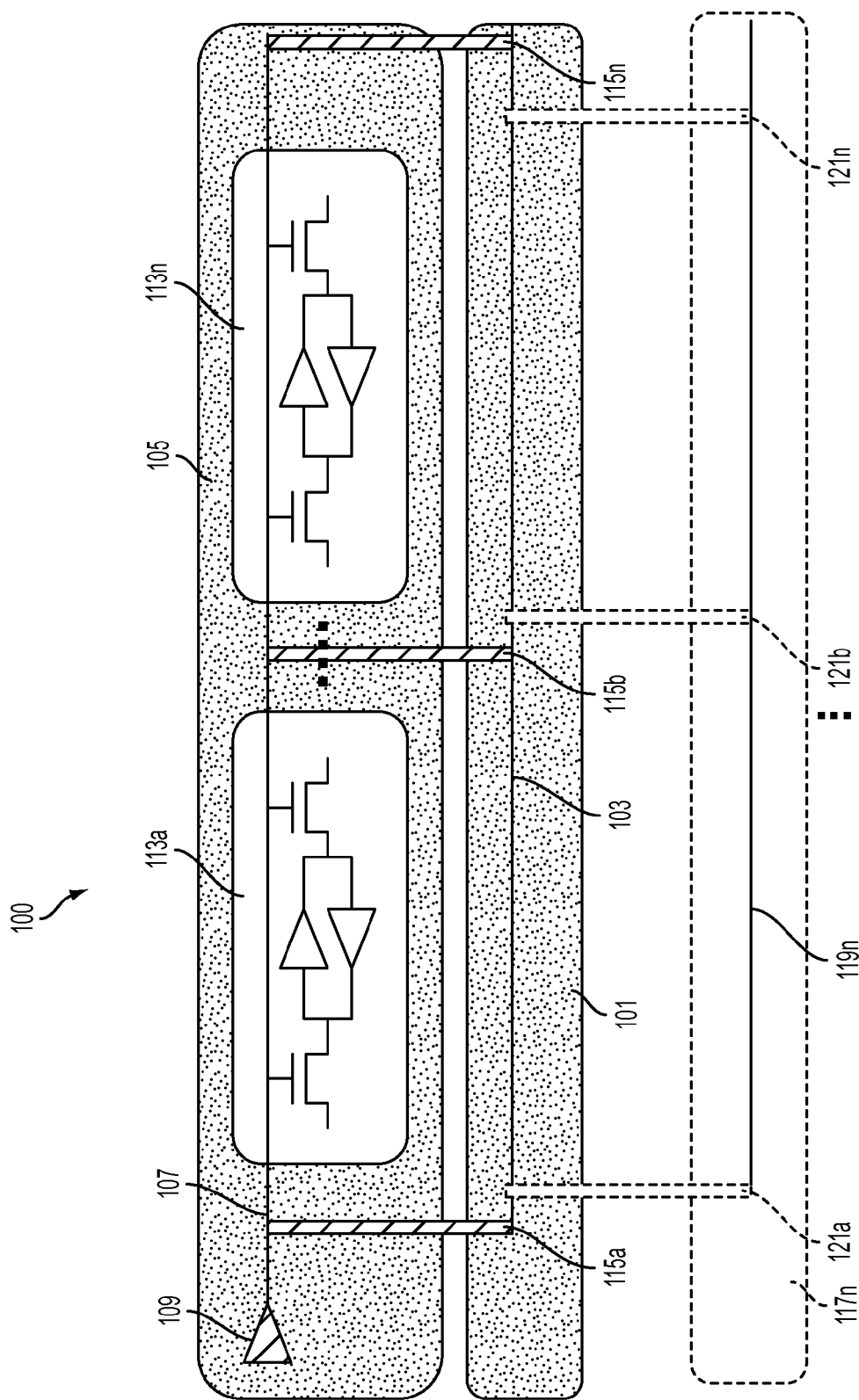
FIG. 1 is a schematic diagram of an integrated circuit, in accordance with one or more embodiments.

FIG. 1 is a schematic diagram of an integrated circuit 100, in accordance with one or more embodiments. The integrated circuit 100 is configured to reduce the resistance of a word line and eliminate or at least minimize any coupling effect that might occur. In some embodiments the integrated circuit 100 is a single port memory comprising single port bit-cells or a multi-port memory comprising multi-port bit-cells. In some embodiments, the integrated circuit 100 is a single port SRAM. In other embodiments, the integrated circuit 100 is a multi-port SRAM.

The integrated circuit 100 includes a first layer 101 comprising a first line 103. The integrated circuit 100 also includes a second layer 105 comprising a word line 107, a word line driver 109 configured to communicate read/write commands along the word line 107, and a series of bit-cells 113a-113n. The integrated circuit 100 further comprises a first plurality of through vias 115a-115n coupling the word line 107 to the first line 103.

The second layer 105 is on or over the first layer 101. In some embodiments, the first layer 101 is on or over the second layer 105.

The word line 107 has a resistance value based on a geometry of the word line 107, such as a cross-sectional area of the word line 107. Because the first plurality of through vias 115a-115n couple the word line 107 to the first line 103, the resistance value of the word line 107 is reduced by a degree associated with a geometry of the first line 103 such as the cross-sectional area of the first line 103. In some embodiments, a cross-sectional area of the first line 103 is equal to a cross-sectional area of the word line 107. Accordingly, if the cross-sectional areas of the first line 103 and the word line 107 are equal, the resistance value of the word line 107 is halved because first line 103 is coupled to the word line 107 by the first plurality of through vias 115a-115n.

The first plurality of through vias 115a-115n comprises through vias positioned between every bit-cell of the series of bit-cells 113a-113n. In some embodiments, the first plurality of through vias 115a-115n comprise through vias positioned between a predetermined number of bit-cells of the series of bit-cells 113a-113n rather than between every bit-cell. For example, in some embodiments, the integrated circuit 100 is configured to have the first plurality of through vias 115a-115n positioned between every other bit-cell of the series of bit-cells 113a-113n, every other ten bit-cells of the series of bit-cells 113a-113n, or another preselected number of bit-cells of the series of bit-cells 113a-113n suitable for coupling the word line 107 to the first line 103 in the first layer 101 in a manner that effectively reduces the resistance of the word line 107.

In some embodiments, the integrated circuit 100 optionally comprises one or more additional layers 117n having one or more additional lines 119n. In some embodiments, the integrated circuit 100 includes one additional layer 117n and one additional line 119n. In other embodiments, the integrated circuit 100 includes more than one additional layer 117n and more than one additional line 119n. The integrated circuit 100 is configurable to have any layout. For example, in some embodiments, the first layer 101 is on a first additional layer 117n and the second layer 105 is on the first layer 101. In other embodiments, the second layer 105 is on the first layer 101 and the first additional layer 117n is on the second layer 105. In some embodiments, greater or lesser number of configurations of the integrated circuit 100 are possible based on the quantity of additional layers 117n.

In one or more embodiments, the integrated circuit 100 comprises one or more additional pluralities of through vias 121*a*-121*n* coupling the additional lines 119*n* to the first line 103 and/or the word line 107.

Each additional layer 117*n* further reduces the resistance of the word line 107 and increases the speed capabilities of the word line 107 of the integrated circuit 100. In some embodiments, the number of additional layers and a geometry of the additional lines 119*n* corresponds to a degree by which the resistance of the word line 107 is reduced. For example, if the integrated circuit comprises an additional layer 117*n*, the first line 103 and the additional line 119*n* are together configured to cause the resistance value of the word line 107 to be reduced by a degree associated with a geometry of the first line 103 and a geometry of the additional line 119*n* such as the cross-sectional area of the first line 103 and the cross-sectional area of the additional line 119*n*.

In some embodiments, a cross-sectional area of the first line 103 is equal to a cross-sectional area of the word line 107 and a cross-sectional area of the additional line 119*n* is equal to a cross-sectional area of the word line 107. Accordingly, if the cross-sectional areas of the first line 103, the word line 107, and the additional line 119*n* are equal, the resistance value of the word line 107 is divided by three because first line 103 is coupled to the word line 107 by the first plurality of through vias 115*a*-115*n* and the additional line 119*n* is coupled to the word line 107 by the additional plurality of through vias 121*a*-121*n*.

In some embodiments, adding additional layers 117*n* also reduces an overall length of the word line 107 thereby reducing the amount of space occupied by the integrated circuit 100 in a top-side or two-dimensional view of the integrated circuit 100.

Figure 2:
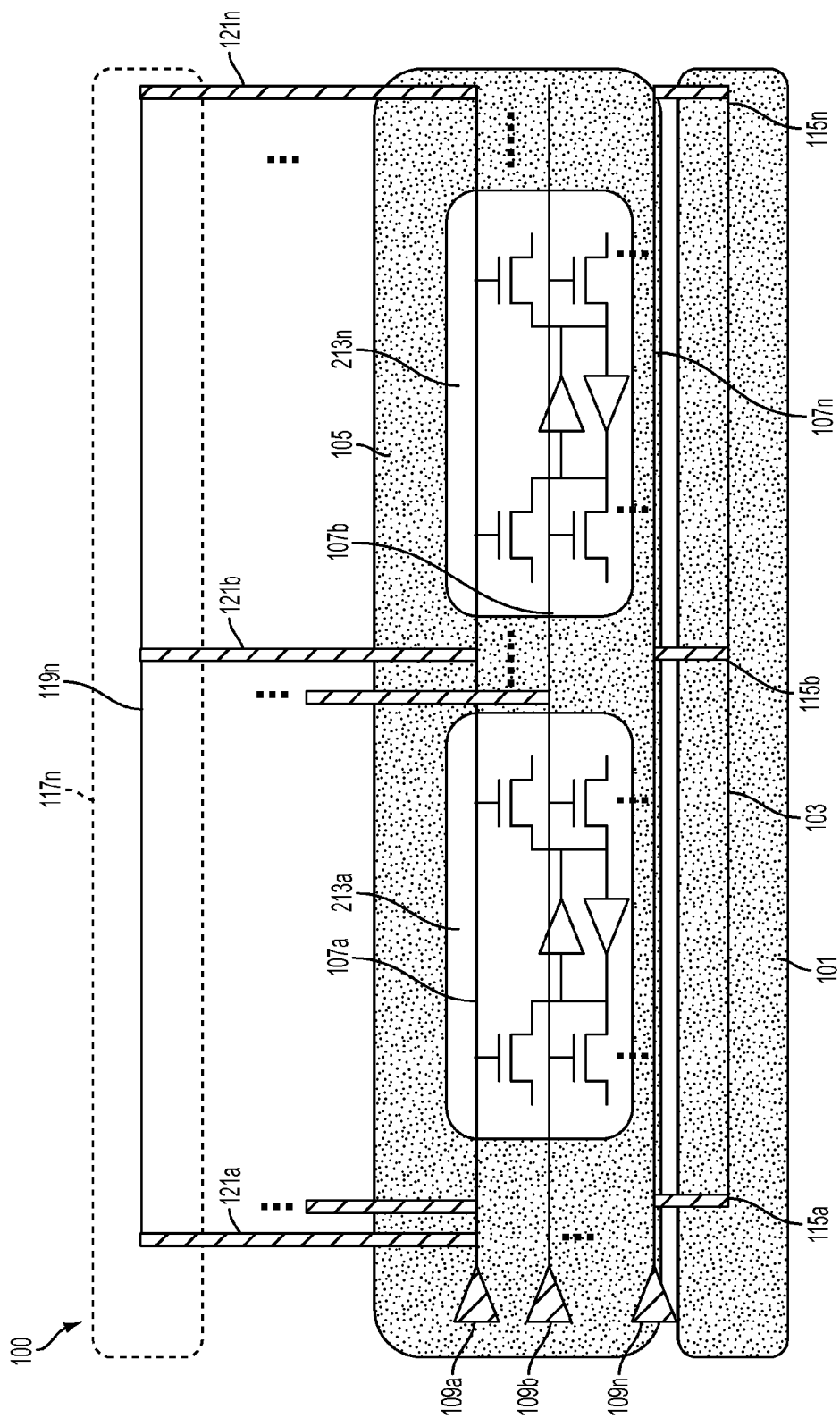
FIG. 2 is a schematic diagram of an integrated circuit, in accordance with one or more embodiments.

FIG. 2 is a schematic diagram of the integrated circuit 100, in accordance with one or more embodiments. The integrated circuit 100 illustrated in FIG. 2 comprises all of the elements discussed above with respect to FIG. 1 and, as an example, illustrates the integrated circuit 100 as having a series of multi-port bit-cells 213*a*-213*n*. Accordingly, the integrated circuit 100, as shown in FIG. 2, is a multi-port memory, or a multi-port SRAM. As discussed above, the integrated circuit 100, in some embodiments, is configured be any of a single port or a multi-port memory. As such, the embodiment of integrated circuit 100 shown in FIG. 2 should not be considered as limiting.

The integrated circuit 100 includes the first layer 101 comprising the first line 103. The integrated circuit 100 also includes the second layer 105. The second layer 105, in this example embodiment, comprises a plurality of word lines 107*a*-107*n*, a plurality of word line drivers 109*a*-109*n* configured to communicate read/write commands along the word lines 107*a*-107*n*, and the series of multi-port bit-cells 213*a*-213*n*. The integrated circuit 100 further comprises the first plurality of through vias 115*a*-115*n* coupling one of the plurality of word lines 107*a*-107*n* to the first line 103.

The second layer 105 is on or over the first layer 101. In some embodiments, the first layer 101 is on or over the second layer 105.

Each word line of the plurality of word lines 107*a*-107*n* has a resistance value based on a geometry of the word line, such as a cross-sectional area of the word line. Because the first plurality of through vias 115*a*-115*n* couple one of the plurality of word lines 107*a*-107*n* to the first line 103, the resistance value of the word line coupled to the first line 103 is reduced by a degree associated with a geometry of the first line 103, such as the cross-sectional area of the first line 103. In some embodiments, a cross-sectional area of the first line 103 is equal to a cross-sectional area of the word line 107. Accordingly, if the cross-sectional areas of the first line 103 and the word line coupled to the first line 103 are equal, the resistance value of the word line coupled to the first line 103 is halved.

The first plurality of through vias 115*a*-115*n* comprises through vias positioned between every bit-cell of the series of multi-port bit-cells 213*a*-213*n*. In some embodiments, the first plurality of through vias 115*a*-115*n* comprise through vias positioned between a predetermined number of bit-cells of the series of multi-port bit-cells 213*a*-213*n* rather than between every bit-cell. For example, in some embodiments, the integrated circuit 100 is configured to have the first plurality of through vias 115*a*-115*n* positioned between every other bit-cell of the series of multi-port bit-cells 213*a*-213*n*, every other ten bit-cells of the series of multi-port bit-cells 213*a*-213*n*, or another preselected number of bit-cells of the series of multi-port bit-cells 213*a*-213*n* suitable for coupling the word line of the plurality of word lines 107*a*-107*n* to the first line 103 in the first layer 101 in a manner that effectively reduces the resistance of the word line coupled to the first line 103.

In some embodiments, the integrated circuit 100 optionally comprises one or more additional layers 117*n* having one or more additional lines 119*n*. In some embodiments, the integrated circuit 100 includes one additional layer 117*n* and one additional line 119*n*. In other embodiments, the integrated circuit 100 includes more than one additional layer 117*n* and more than one additional line 119*n*. The integrated circuit 100 is configurable to have any layout. For example, in some embodiments, the first layer 101 is on a first additional layer 117*n* and the second layer 105 is on the first layer 101. In other embodiments, the second layer 105 is on the first layer 101 and the first additional layer 117*n* is on the second layer 105. In some embodiments, greater or lesser number of configurations of the integrated circuit 100 are possible based on the quantity of additional layers 117*n*.

In one or more embodiments, the integrated circuit 100 comprises one or more additional pluralities of through vias 121*a*-121*n* coupling the additional lines 119*n* to any combination of the first line 103 and/or the word line of the plurality of word lines 107*a*-107*n* coupled to the first line, any of the other word lines of the plurality of word lines 107*a*-107*n*, and/or any other additional lines 119*n*.

Each additional layer 117*n* further reduces the resistance of the word line of the plurality of word lines 107*a*-107*n* coupled to the first line 103, or reduces the resistance of any word line of the plurality of word lines 107*a*-107*n* to which an additional layer 117*n* is coupled. Additional layers 117*n* increase the speed capabilities of the plurality of word lines 107*a*-107*n* of the integrated circuit 100. In some embodiments, the number of additional layers and a geometry of the additional lines 119*n* corresponds to a degree by which the resistance of any word line of the plurality of word lines 107*a*-107*n* coupled to one or more of the first line 103 or any additional lines 119*n* is reduced. For example, if the integrated circuit comprises an additional layer 117*n*, the first line 103 and the additional line 119*n* are together configured to cause the resistance value of the word line 107 coupled to the first line 103 and the additional line 119*n* to be reduced by a degree associated with a geometry of the first line 103 and a geometry of the additional line 119*n* such as the cross-sectional area of the first line 103 and the cross-sectional area of the additional line 119*n*.

In some embodiments, a cross-sectional area of the first line 103 is equal to a cross-sectional area of the word line of the plurality of word lines 107*a*-107*n* to which the first line 103 is coupled, and a cross-sectional area of the additional line 119*n* is equal to a cross-sectional area of the word line of the plurality of word lines 107a-107n to which the additional line 119n is coupled. Accordingly, if the cross-sectional areas of the first line 103, the word line of the plurality of word lines 107a-107n, and the additional line 119n are equal, the resistance value of the word line of the plurality of word lines 107a-107n to which the first line 103 and the additional line 119n are coupled is divided by three because first line 103 is coupled to the word line of the plurality of word lines 107a-107n by the first plurality of through vias 115a-115n and the additional line 119n is coupled to the word line of the plurality of word lines 107a-107n by the additional plurality of through vias 121a-121n.

In some embodiments, adding additional layers 117n also reduces an overall length of a word line of the plurality of word lines 107a-107n to which the additional layer(s) 117n is/are attached thereby reducing the amount of space occupied by the integrated circuit 100 in a top-side or two-dimensional view of the integrated circuit 100.

Figure 3:
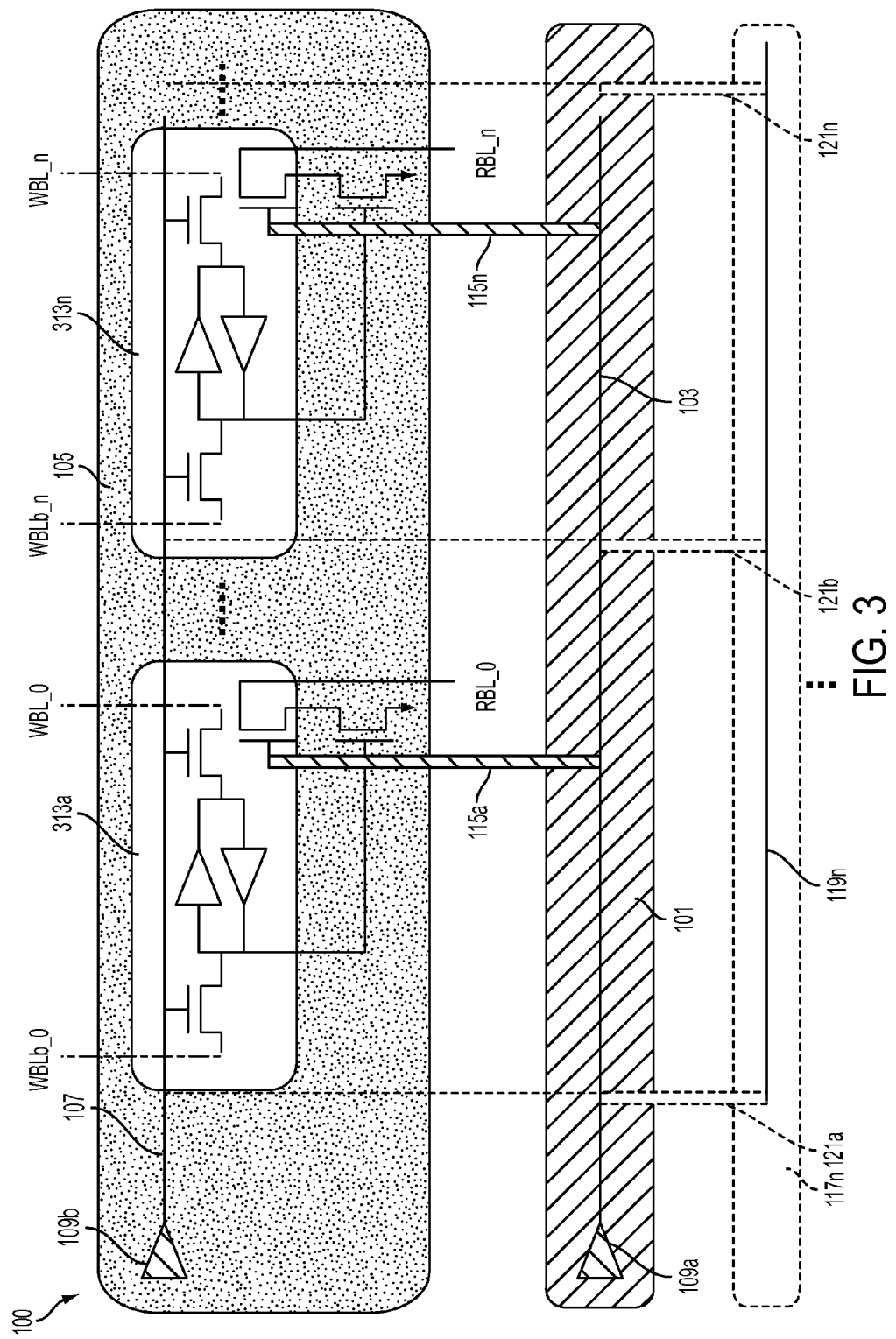
FIG. 3 is a schematic diagram of an integrated circuit, in accordance with one or more embodiments.

FIG. 3 is a schematic diagram of the integrated circuit 100, in accordance with one or more embodiments. The integrated circuit 100 illustrated in FIG. 3 comprises all of the elements discussed above with respect to FIG. 1 and, as an example, illustrates the integrated circuit 100 as having a series of bit-cells 313a-313n that are two-port register file (2PRF) bit-cells configured to enable separation of a read word line and a write word line into separate layers to minimize or eliminate read/write word line coupling. Accordingly, the integrated circuit 100, as shown in FIG. 3, is a multi-port memory, or a multi-port SRAM. As discussed above, the integrated circuit 100, in some embodiments, is configured be any of a single port or a multi-port memory. As such, the embodiment of integrated circuit 100 shown in FIG. 3 should not be considered as limiting.

The integrated circuit 100 includes the first layer 101. The first layer 101 comprises the first line 103 and a first word line driver 109a. The integrated circuit 100 also includes the second layer 105. The second layer 105 comprises the word line 107, a second word line driver 109b, and the series of bit-cells 313a-313n coupled by the word line 107.

Second layer 105 is on the first layer 101. In some embodiments, the first layer 101 is on the second layer 105. In some embodiments, the integrated circuit 100 optionally includes one or more additional layers 117n and corresponding additional lines 119n. As such, in one or more embodiments, the first layer 101 is on an additional layer 117n and the second layer 105 is on the first layer 101. In other embodiments, the second layer 105 is on the first layer 101 and an additional layer 117n is on the second layer 105. In some embodiments, the integrated circuit 100 is configured to have any number of additional layers 117n and corresponding additional lines 119n arranged in any order.

The first word line driver 109a is a read word line driver configured to communicate read commands along the first line 103. As such, the first line 103 is a read word line. The second word line driver 109b is a write word line driver configured to communicate write commands along the word line 107. As such, the word line 107 is a write word line.

In some embodiments, first word line driver 109a is a write word line driver configured to communicate write commands along the first line 103. As such, the first line 103 is a write word line. The second word line driver 109b is a read word line driver configured to communicate read commands along the word line 107. As such, the word line 107 is a read word line.

The integrated circuit 100 includes the first plurality of through vias 115a-115n coupling each of the bit-cells of the series of bit-cells 313a-313n to the first line 103.

If the integrated circuit 100 includes one or more additional layers 117n, each having additional lines 119n, the integrated circuit 100 accordingly includes the additional plurality of through vias 121a-121n coupling additional lines 119n to the first line 103 and/or the word line 107. In some embodiments, one or more additional lines 119n are together coupled with the first line 103 as a first group of additional lines 119n and/or one or more additional lines 119n are together coupled with the word line 107 as a second group.

Each additional line 119n coupled to the first line 103 reduces a resistance value of the first line 103 by a degree associated with a geometry of the additional line 119n. For example, if a cross-sectional area of an additional line 119n of an additional layer 117n and a cross-sectional area of the first line 103 are equal, the additional line 119n causes the resistance value of the first line 103 to be halved. Similarly, if the integrated circuit 100 includes another additional layer 117n having another additional line 119n with a cross-sectional area equal to the first line 103 and the other additional line 119n, the coupling of the two additional lines 119n causes the resistance value of the first line 103 to be divided by three.

If the integrated circuit 100 additionally or alternatively includes one or more additional layers 117n having corresponding additional lines 119n coupled to the word line 107 by way of one or more additional plurality of through vias 121a-121n, the additional lines 119n reduce the resistance value of the word line 107 in the same manner as that discussed above with respect to first line 103.

Figure 4:
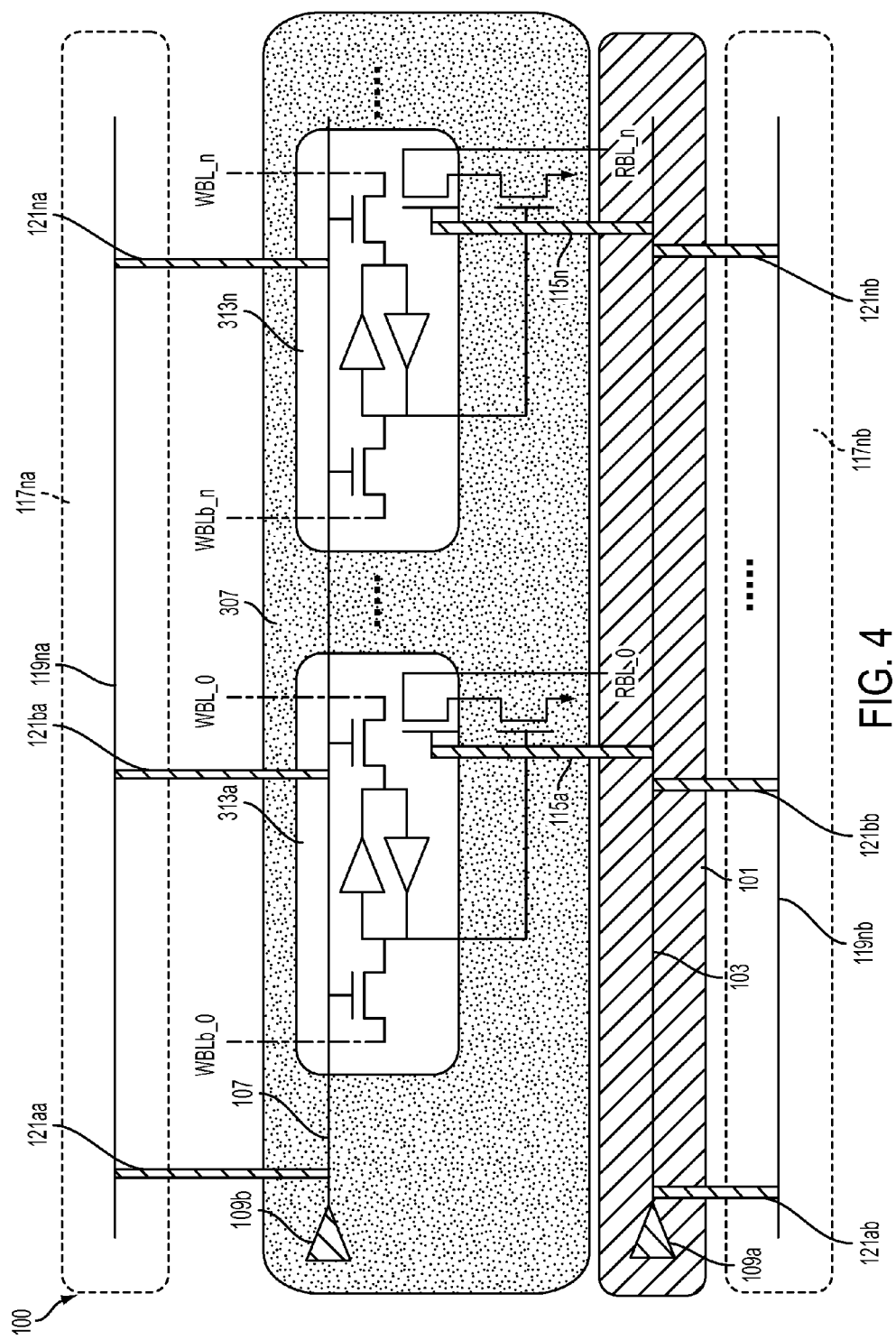
FIG. 4 is a schematic diagram of an integrated circuit, in accordance with one or more embodiments.

FIG. 4 is a schematic diagram of the integrated circuit 100, in accordance with one or more embodiments. The integrated circuit 100 illustrated in FIG. 4 comprises all of the elements discussed above with respect to FIG. 3 and, as an example, illustrates the integrated circuit 100 shown in FIG. 3 as having two additional layers 117n, i.e., 117na and 117nb. As discussed above, the integrated circuit 100, in some embodiments, is configured to have any number of additional layers 117n. As such, the embodiment of integrated circuit 100 shown in FIG. 4 should not be considered as limiting.

In this example, a first additional layer 117na comprising a first additional line 119na is coupled to the word line 107 by a first set of additional through vias 121aa-121na. The first additional line 119na is configured to reduce the resistance of word line 107. Additionally, a second additional layer 117nb comprising a second additional line 119nb is coupled to the first line 103 by a second set of additional through vias 121ab-121nb. As discussed above, the second additional line 119nb is configured to reduce the resistance of the first line 103.

Figure 5:
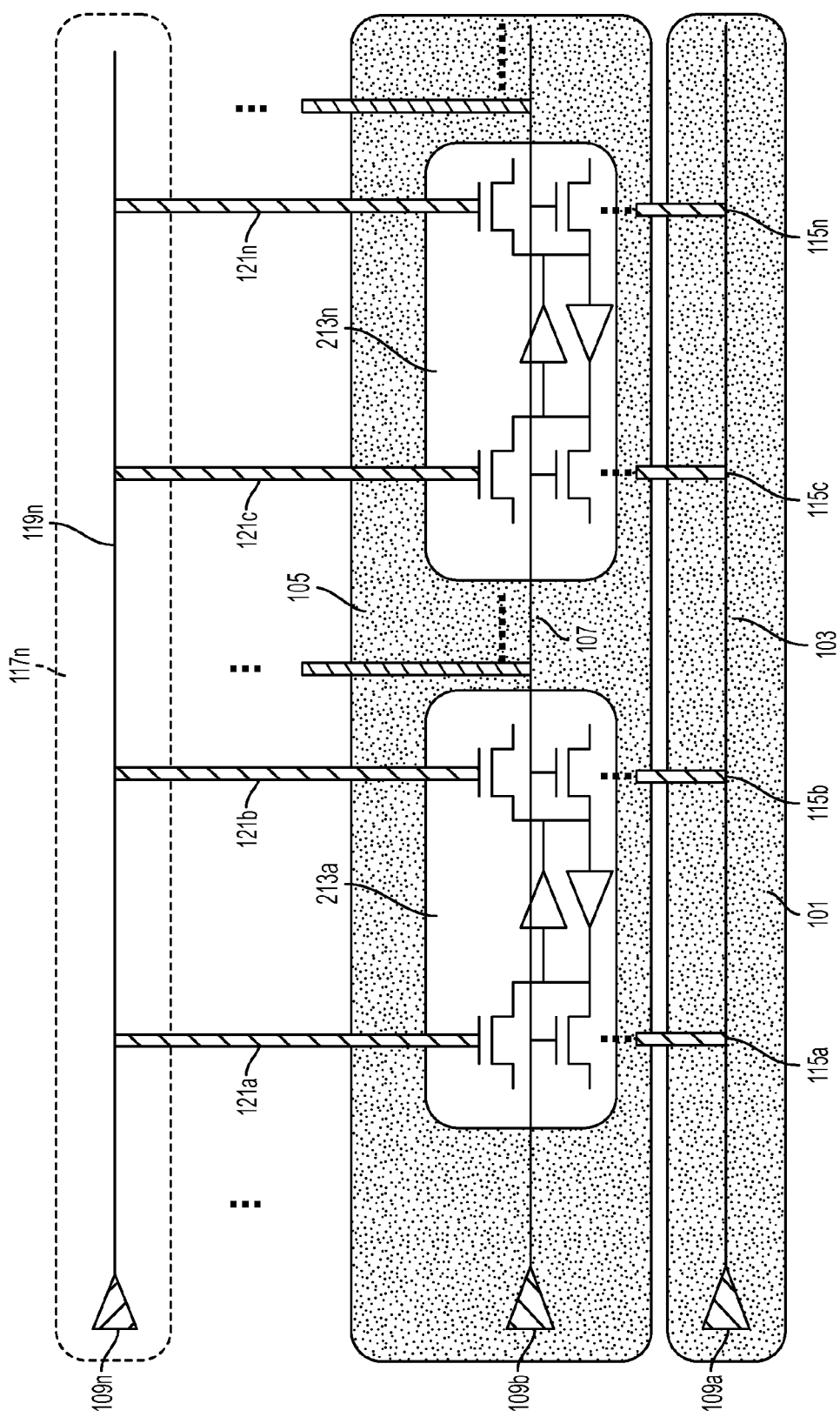
FIG. 5 is a schematic diagram of an integrated circuit, in accordance with one or more embodiments.

FIG. 5 is a schematic diagram of the integrated circuit 100, in accordance with one or more embodiments. The integrated circuit 100 illustrated in FIG. 5 comprises all of the elements discussed above with respect to FIG. 1 and, as an example, illustrates the integrated circuit 100 as having the series of multi-port bit-cells 213a-213n. Accordingly, the integrated circuit 100, as shown in FIG. 5, is a multi-port memory. As discussed above, the integrated circuit 100, in some embodiments, is configured be any of a single port or a multi-port memory. As such, the embodiment of integrated circuit 100 shown in FIG. 5 should not be considered as limiting. The example embodiment of integrated circuit 100 shown in FIG. 5 separates a read word line and a write word line into separate layers to minimize or eliminate read/write word line coupling, for example.

The integrated circuit 100 includes the first layer 101. The first layer comprises the first line 103 and a first word line driver 109a of a plurality word line drivers 109a-109n. The integrated circuit 100 also includes the second layer 105. The second layer 105 comprises the word line 107, a second word line driver 109b of the plurality of word line drivers 109a-109n, and the series of multi-port bit-cells 213a-213n. The series of multi-port bit-cells 213a-213n are coupled by the word line 107. The integrated circuit 100 additionally comprises one or more additional layers 117n having one or more additional lines 119n and one or more additional word line drivers 109n. In some embodiments, the integrated circuit 100 includes one additional layer 117n, one additional line 119n, and one additional word line driver 109n. In other embodiments, the integrated circuit 100 includes more than one additional layer 117n, more than one additional line 119n, and more than one additional word line driver 109n.

The first word line driver 109a is either of a read word line driver configured to communicate read commands along the first line 103 or a write word line driver configured to communicate write commands along the first line 103. The second word line driver 109b is either of a read word line driver configured to communicate read commands along the word line 107 or a write word line driver configured to communicate write commands along the word line 107. Similarly, the one or more additional word line driver 109n are either of a read word line driver configured to communicate read commands along a corresponding additional line 119n or a write word line driver configured to communicate write commands along a corresponding additional line 119n.

The integrated circuit 100 includes the first plurality of through vias 115a-115n coupling each of the bit-cells of the series of multi-port bit-cells 213a-213n to the first line 103. The integrated circuit 100 also includes one or more additional pluralities of through vias 121a-121n coupling corresponding additional lines 119n to any of the first line 103, each bit-cell of the series of multi-port bit-cells 213a-213n, the word line 107, and/or any of the additional lines 119n. Any additional lines 119n coupled to, for example, the first line 103, the word line 107, and/or any other additional lines 119n reduce the resistance value of the first line 103, word line 107, and/or any other additional lines 119n in the same manner as that discussed above with respect to first line 103.

Figure 6:
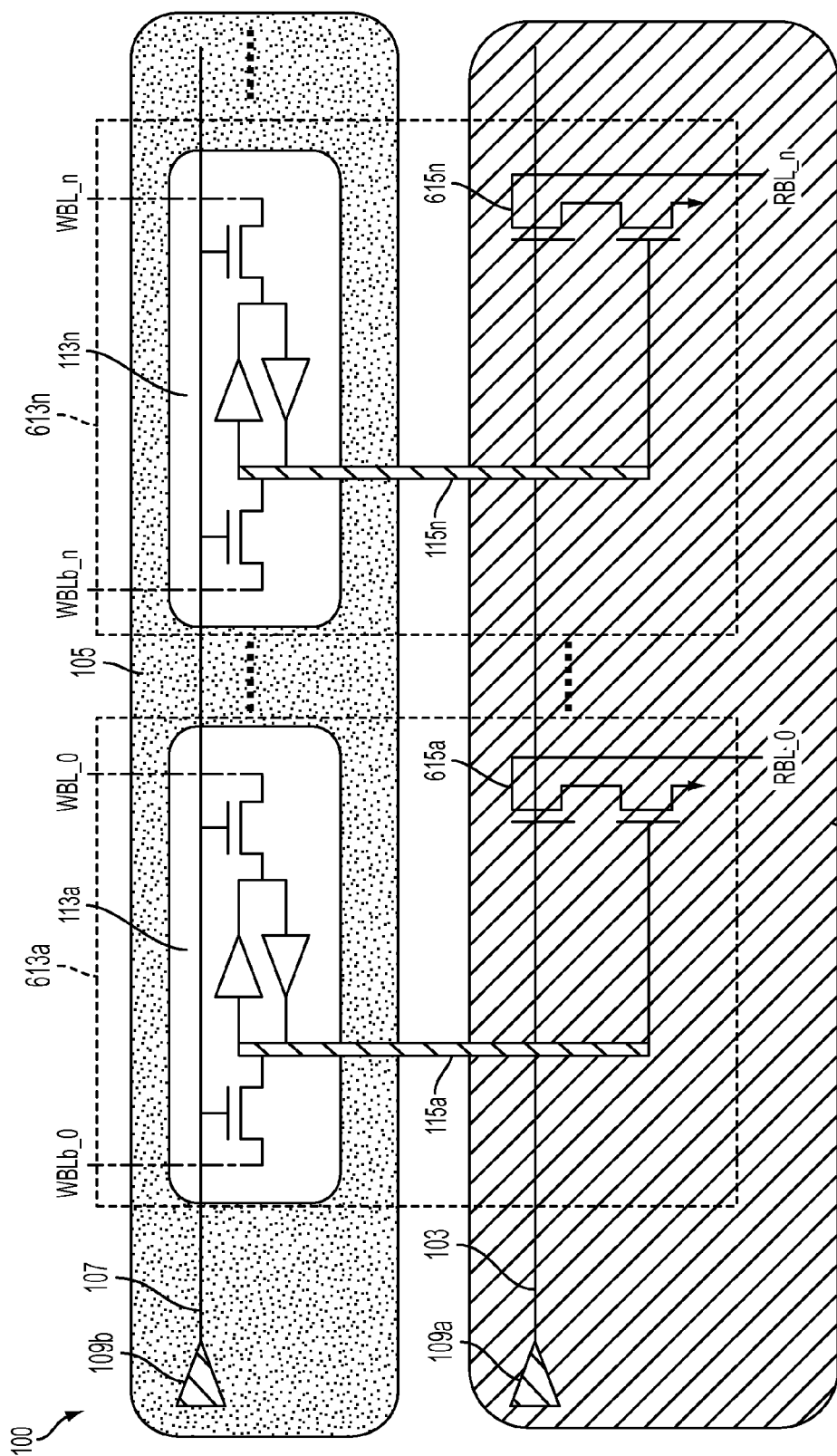
FIG. 6 is a schematic diagram of an integrated circuit, in accordance with one or more embodiments.

FIG. 6 is a schematic diagram of the integrated circuit 100, in accordance with one or more embodiments. The integrated circuit 100 illustrated in FIG. 6 comprises all of the elements discussed above with respect to FIG. 1 and, as an example, illustrates the integrated circuit 100 as having a series of divided bit-cells 613a-613n split among multiple layers making the divided bit-cells 613a-613n two-port register file (2PRF) bit-cells configured to enable separation of a read word line and a write word line into separate layers to minimize or eliminate read/write word line coupling. As discussed above, the integrated circuit 100, in some embodiments, is configured be any of a single port or a multi-port memory. As such, the embodiment of integrated circuit 100 shown in FIG. 6 should not be considered as limiting.

As shown in FIG. 6, the integrated circuit 100 includes the first layer 101. The first layer 101 comprises the first line 103, a first word line driver 109a, and series of bit-cell portions 615a-615n. The integrated circuit 100 also includes the second layer 105. The second layer 105 comprises the word line 107, a second word line driver 109b and the series of bit-cells 113a-113n coupled by the word line 107.

Second layer 105 is on the first layer 101. In some embodiments, the first layer 101 is on the second layer 105. In some embodiments, the integrated circuit 100 optionally includes one or more additional layers 117n and corresponding additional lines 119n such as that discussed above.

The first word line driver 109a is a read word line driver configured to communicate read commands along the first line 103. As such, the first line 103 is a read word line. The second word line driver 109b is a write word line driver configured to communicate write commands along the word line 107. As such, the word line 107 is a write word line.

In some embodiments, first word line driver 109a is a write word line driver configured to communicate write commands along the first line 103. As such, the first line 103 is a write word line. The second word line driver 109b is a read word line driver configured to communicate read commands along the word line 107. As such, the word line 107 is a read word line.

The integrated circuit 100 includes the first plurality of through vias 115a-115n coupling each of the bit-cells of the series of bit-cells 113a-113n to corresponding bit-cell portions of the series of bit-cell portions 615a-615n. The series of bit-cells 113a-113n and the series of bit-cell portions 615a-615n together form the series of divided bit-cells 613a-613b. As discussed above, the integrated circuit 100 optionally includes any number of additional layers 117n and corresponding additional lines 119n to reduce line resistance of any combination of first line 103, word line 107 and/or any additional lines 119n.

Figure 7:
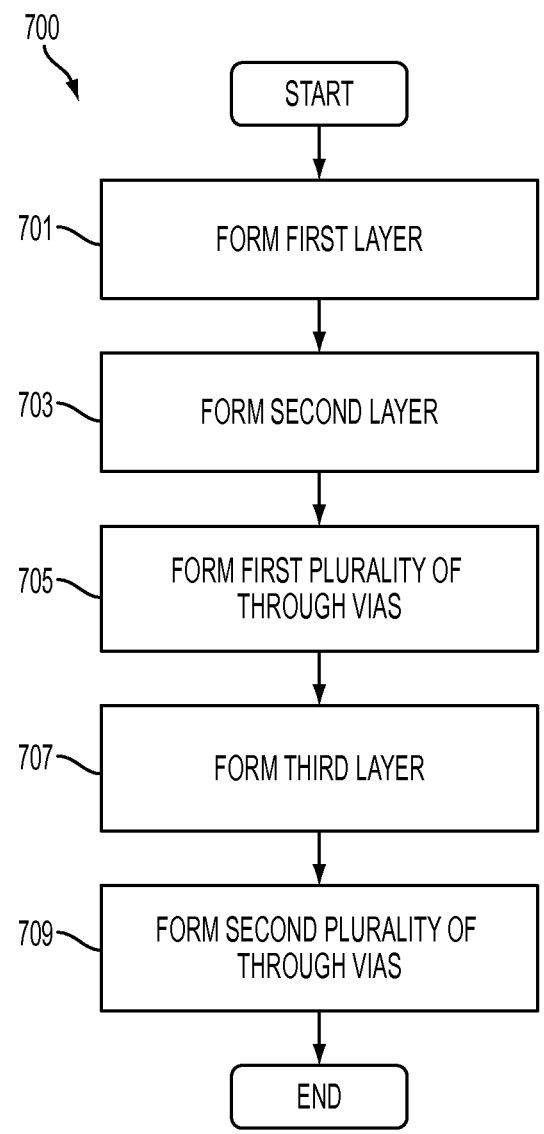
FIG. 7 is a flowchart of a process associated with forming an integrated circuit, in accordance with one or more embodiments.

FIG. 7 is a flowchart of a process 700 for forming an integrated circuit having a three-dimensional structure configured to reduce word line resistance and coupling, in accordance with one or more embodiments. The process begins with step 701 in which a first layer is formed comprising a first line. In step 703, a second layer is formed comprising a series of bit-cells, a word line driver, and a word line coupled to the word line driver. In step 705, a first plurality of through vias is formed coupling the word line to the first line. In step 707, a third layer is formed comprising a second line. In step 709, a second plurality of through vias is formed coupling the second line to the first line.

One aspect of this description relates to a memory comprising a first layer comprising a first line. The memory also comprises second layer comprising a series of bit-cells, a word line driver, and a word line coupled to the word line driver. The memory further comprises a first plurality of through vias coupling the word line to the first line. The word line has a resistance value based on a geometry of the word line, and the first line is configured to reduce the resistance value of the word line by a degree associated with a geometry of the first line.

Another aspect of this description relates to a memory comprising a first layer comprising a first word line and a first word line driver. The memory also comprises a second layer comprising a series of bit-cells, a second word line, and a second word line driver. The memory further comprises a first plurality of through vias coupling each of the bit-cells of the series of bit-cells to the first word line.

Still another aspect of this description relates to a method comprising forming a first layer comprising a first line. The method also comprises forming a second layer comprising a series of bit-cells, a word line driver, and a word line coupled to the word line driver. The method further comprises forming a first plurality of through vias coupling the word line to the first line. The word line has a resistance value based on a geometry of the word line, and the first line is configured to reduce the resistance value of the word line by a degree associated with a geometry of the first line.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A memory comprising:
   a first layer on a first level, the first layer comprising a first line;
   a second layer on a second level different from the first level, the second layer comprising:
      a series of bit-cells;
      a word line driver; and
      a word line coupled to the word line driver; and
   a first plurality of through vias coupling the word line to the first line,
   wherein the word line has a resistance value based on a geometry of the word line, and the first line is configured to reduce the resistance value of the word line by a degree associated with a geometry of the first line.

2. The memory of claim 1, wherein the first plurality of through vias comprises through vias positioned between every bit-cell of the series of bit-cells.

3. The memory of claim 1, wherein the first plurality of through vias comprises through vias positioned between a predetermined number of bit-cells of the series of bit-cells other than between every bit-cell of the series of bit-cells.

4. The memory of claim 1, further comprising:
   a third layer on a third level different from the first level and different from the second level, the third layer comprising a second line; and
   a second plurality of through vias coupling the second line to the first line,
   wherein the first layer and the third layer are together configured to reduce the resistance value of the word line by a degree associated with the geometry of the first line and a geometry of the second line.

5. The memory of claim 4, wherein the first layer is over the third layer and the second layer is over the first layer.

6. The memory of claim 4, wherein the second layer is over the first layer and the third layer is over the second layer.

7. The memory of claim 1, wherein the second layer is over the first layer.

8. A method comprising:
   forming a first layer on a first level, wherein the first layer is formed comprising a first line;
   forming a second layer on a second level different from the first level, wherein the second layer is formed comprising:
      a series of bit-cells;
      a word line driver; and
      a word line coupled to the word line driver; and
   coupling the word line to the first line with a first plurality of through vias,
   wherein the word line has a resistance value based on a geometry of the word line, and coupling the word line with the first line reduces the resistance value of the word line by a degree associated with a geometry of the first line.

9. The method of claim 8, wherein coupling the word line to the first line with the first plurality of through vias comprises coupling the word line to the first line using through vias positioned between every bit-cell of the series of bit-cells.

10. The method of claim 9, further comprising:
    forming a third layer on a third level different from the first level and different from the second level, the third layer being formed comprising a second line; and
    coupling the second line to the first line to further reduce the resistance value of the word line by a degree associated with the geometry of the first line and a geometry of the second line.

11. The method of claim 10, wherein the first layer is formed over the third layer and the second layer is formed over the first layer.

12. The method of claim 10, wherein the second layer is formed over the first layer and the third layer is formed over the second layer.

13. The method of claim 8, wherein the second layer is formed over the first layer.

14. The method of claim 8, wherein coupling the word line to the first line with the first plurality of through vias comprises coupling the word line to the first line using through vias positioned between a predetermined number of bit-cells of the series of bit-cells other than between every bit-cell of the series of bit-cells.

15. A memory comprising:
    a first layer on a first level, the first layer comprising a first line, the first line having a first cross-sectional area;
    a second layer on a second level different from the first level, the second layer comprising
       a series of bit-cells;
       a word line driver; and
       a word line coupled to the word line driver, the word line having a second cross-sectional area; and
    a first plurality of through vias coupling the word line to the first line,
    wherein the first cross-sectional area is equal to the second cross-sectional area, the word line has a resistance value, and the resistance value is reduced by at least 50% based on the first line being coupled with the word line.

16. The memory of claim 15, wherein the first plurality of through vias comprises through vias positioned between every bit-cell of the series of bit-cells.

17. The memory of claim 15, wherein the first plurality of through vias comprises through vias positioned between a predetermined number of bit-cells of the series of bit-cells other than between every bit-cell of the series of bit-cells.

18. The memory of claim 15, further comprising:
    a third layer on a third level different from the first level and different from the second level, the third layer comprising a second line; and
    a second plurality of through vias coupling the second line to the first line,
    wherein the first layer and the third layer are together configured to reduce the resistance value of the word line by a degree associated with the geometry of the first line and a geometry of the second line.

19. The memory of claim 18, wherein the first layer is over the third layer and the second layer is over the first layer.

20. The memory of claim 18, wherein the second layer is over the first layer and the third layer is over the second layer.

* * * * *